United States Patent
Shiina et al.

(10) Patent No.: US 11,073,856 B2
(45) Date of Patent: Jul. 27, 2021

(54) INPUT CIRCUIT HAVING HYSTERESIS WITHOUT POWER SUPPLY VOLTAGE DEPENDENCE

(71) Applicant: ABLIC Inc., Chiba (JP)

(72) Inventors: Yoshiomi Shiina, Chiba (JP); Fumimasa Azuma, Phnom Penh (KH)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/750,802

(22) Filed: Jan. 23, 2020

(65) Prior Publication Data

US 2020/0249710 A1  Aug. 6, 2020

(30) Foreign Application Priority Data

Jan. 31, 2019 (JP) .............................. JP2019-015006

(51) Int. Cl.
  *G05F 1/575* (2006.01)
  *H03K 3/356* (2006.01)
  *H03K 19/0185* (2006.01)

(52) U.S. Cl.
  CPC ......... *G05F 1/575* (2013.01); *H03K 3/35613* (2013.01); *H03K 19/018585* (2013.01)

(58) Field of Classification Search
  CPC .. G05F 1/575; H03K 3/3565; H03K 3/35613; H03K 19/018585
  See application file for complete search history.

(56) References Cited

U.S. PATENT DOCUMENTS

2011/0109364 A1*  5/2011  Yamasaki ............ H03K 3/3565
                                                    327/206
2017/0093378 A1*  3/2017  Sugiura ................ H03K 3/3565

FOREIGN PATENT DOCUMENTS

JP          H09-270678 A     10/1997

\* cited by examiner

*Primary Examiner* — Kyle J Moody
*Assistant Examiner* — Jye-June Lee
(74) *Attorney, Agent, or Firm* — Brinks Gilson & Lione

(57) ABSTRACT

An input circuit includes a first input transistor and a second input transistor connected to an input terminal; a current source which makes a current flow in the second input transistor through a current mirror; a switch provided between the current mirror and the current source, and having a switch control terminal connected to the drain of the first input transistor; and a transistor connected to the first input transistor, on/off of the transistor being controlled by an output signal, wherein a current drivability of the second input transistor is switched by an output signal, and a threshold voltage to the input signal is determined based on the current drivability of the second input transistor and the current source.

2 Claims, 5 Drawing Sheets

PRIOR ART

INPUT CIRCUIT HAVING HYSTERESIS WITHOUT POWER SUPPLY VOLTAGE DEPENDENCE

RELATED APPLICATIONS

This application claims priority to Japanese Patent Application No. 2019-015006 filed on Jan. 31, 2019, the entire content of which is incorporated herein by reference.

BACKGROUND OF THE INVENTION

1. Field of the Invention

The present invention relates to an input circuit.

2. Description of the Related Art

FIG. 5 is a circuit diagram of a conventional input circuit in prior art. The conventional input circuit includes an input terminal 510, an output terminal 511, an NMOS transistor 502, PMOS transistors 503, 504, and an inverter 521.

The NMOS transistor 502 has the gate connected to the input terminal 510, the drain connected to the drain of the transistor 503 and the input of the inverter 521, and the source connected to a second power-supply terminal. The PMOS transistor 503 has the gate connected to the input terminal 510 and the source connected to a first power-supply terminal. The PMOS transistor 504 has the gate connected to the output of the inverter 521 and the output terminal 511, the source connected to the first power-supply terminal, and the drain connected to the input of the inverter 521.

In response to an L-level signal supplied to the input terminal 510, the input circuit outputs the L-level signal from the output terminal 511. The PMOS transistor 504 turns on to change the input of inverter 521 to H level. Corresponding to the rise of the input signal from L level, the output signal of the inverter 521 transitions from L level to H level based on the difference between the current drivability of the NMOS transistor 502 and the current drivability of both the PMOS transistor 503 and the PMOS transistor 504.

Further, corresponding to the fall of the input signal from H level, the output signal from the inverter 521 transitions from H level to L level based on the difference between the current drivability of the transistor 502 and the current drivability of the transistor 503.

In the input circuit the threshold voltage at which the output signal transitions from L level to H level is higher than the threshold voltage at which the output signal transitions from H level to L level. In other words, the input circuit has a hysteresis.

Since the hysteresis of the conventional input circuit, however, depends on the current drivability at turning-on of the PMOS transistor 504, that is, at the time when the power-supply voltage (VDD-VSS) is applied between the gate and the source, power-supply voltage dependence exists.

SUMMARY OF THE INVENTION

It is an object of the present invention to provide an input circuit having a hysteresis without power-supply voltage dependence.

According to an embodiment of the present invention an input circuit which provides an output signal corresponding to an input signal, includes an input terminal; an output terminal; a first input transistor having a gate connected to the input terminal and a source connected to a second power-supply terminal; a second input transistor having a gate connected to the input terminal and a source connected to the second power-supply terminal, and configured to provide, from the output terminal, an output signal based on a voltage of a drain; a transistor having a drain connected to a drain of the first input transistor and a source connected to a first power-supply terminal, turning on/off of the transistor being controlled by a signal based on the output signal; a current source having one end connected to the second power-supply terminal; a first switch having one end connected to the other end of the current source and a switch control terminal connected to the drain of the first input transistor; and a current mirror having an input terminal connected to the other end of the first switch, an output terminal connected to a drain of the second input transistor, and a current mirror control gate connected to the other end of the current source, a current drivability of the second input transistor being switched by the output signal, and a threshold voltage to the input signal being determined based on the current drivability of the second input transistor and the current source.

According to the input circuit of the present invention, it is possible to provide an input circuit having a hysteresis without power-supply voltage dependence since the threshold voltage is determined by the current drivability of the input transistor and the current source.

DETAILED DESCRIPTION OF THE PREFERRED EMBODIMENTS

Figure 1:
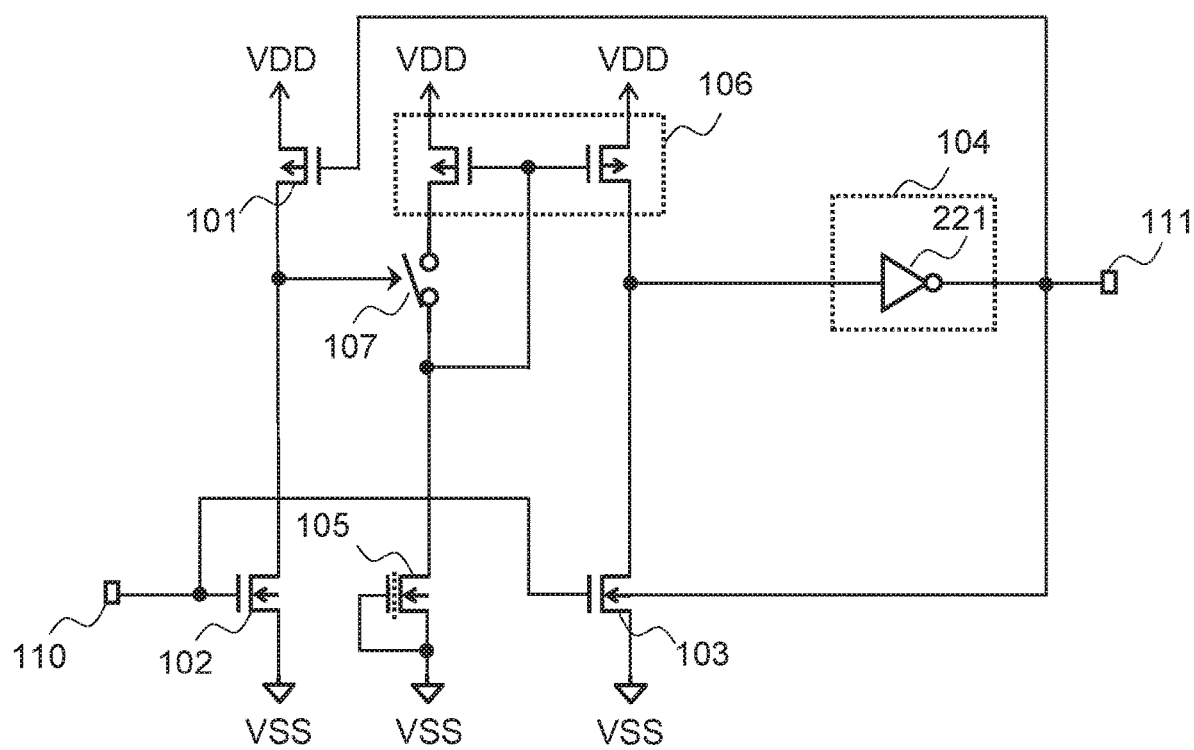
FIG. 1 is a circuit diagram illustrating an input circuit according to an embodiment of the present invention.

FIG. 1 is a circuit diagram illustrating an input circuit according to the embodiment of the present invention.

The input circuit according to the embodiment includes an input terminal 110 to which an input signal is supplied, an output terminal 111 which outputs an output signal, a PMOS transistor 101, an NMOS transistor 102 as a first input transistor, an NMOS transistor 103 as a second input transistor, a buffer 104, a current source 105, a current mirror 106, and a switch 107.

The NMOS transistor 102 has the gate connected to the input terminal 110, the drain connected to a switch control terminal of the switch 107 and the drain of the PMOS transistor 101, and the source connected to a second power-supply terminal. The current source 105 is formed, for example, of a depletion transistor, and has one terminal connected to the current-mirror control gate of the current mirror 106 and one terminal of the switch 107, and the other terminal connected to the second power-supply terminal.

The other terminal of the switch 107 is connected to an input terminal of the current mirror 106.

The NMOS transistor 103 has the gate connected to the input terminal 110, the drain connected to an input terminal of the buffer 104 and an output terminal of the current mirror 106, and the source connected to the second power-supply terminal. The output terminal of the buffer 104 is connected to the output terminal 111, a control terminal of the NMOS transistor 103, and the gate of the PMOS transistor 101. The source of the PMOS transistor 101 is connected to the first power-supply terminal.

The current drivability of the NMOS transistor 103 is controlled by the output signal of the buffer 104 supplied to the control terminal. The buffer 104 is formed, for example, of an inverter 221 alone. The switch 107 turns on at L level of the voltage at the switch control terminal, while the switch 107 turns off at H level of the voltage.

When the input signal is at L level, the output signal is at L level, and the impedance of the NMOS transistor 102 is high, and the impedance of the PMOS transistor 101 is low, the switch 107 turns off because the voltage at the switch control terminal is H level, hence controlling the current mirror 106 not to perform mirror operation. Since the current-mirror control gate of the current mirror 106 is short-circuited by the current source 105 to the second power-supply voltage VSS, the output terminal becomes H level. Further, since the impedance of the NMOS transistor 103 is high, the input of the buffer 104 is H level and the output, i.e., the voltage at the output terminal 111 is L level. At this time, since the output of the buffer 104, i.e., the control signal is at L level, the current drivability of the NMOS transistor 103 is controlled to be small. In the input circuit, the threshold voltage is hence made high upon transition of the output signal to H level.

The input circuit according to the embodiment also has the effect of making the current consumption low because the switch 107 turns off at L level of the input signal to make the impedances of the NMOS transistor 102 and the NMOS transistor 103 high, hence shutting down the respective current paths.

As the voltage of the input signal slightly increases from L level, the impedance of the NMOS transistor 103 becomes low. Since the current drivability of the NMOS transistor 103 is controlled to be small by the output signal from the buffer 104, the input to the buffer 104 remains at H level. Similarly, the impedance of the NMOS transistor 102 becomes low. Here, even though the impedance of the PMOS transistor 101 is also low, the voltage at the switch control terminal becomes L level to turn on the switch 107 since the current drivability of the PMOS transistor 101 is set smaller than that of the NMOS transistor 102, resulting in controlling the current mirror 106 to perform mirror operation. At this time, the input to the buffer 104 is determined based on the difference between the current drivability of the NMOS transistor 103 and the magnitude of the current obtained by the current mirror 106 mirroring the current from the current source 105.

When the input signal becomes H level, the current drivability of the NMOS transistor 103 is controlled to be large since the output signal is H level and the control signal of the NMOS transistor 103 is H level. Since the output signal of the input circuit is determined based on the difference between the current drivability of the NMOS transistor 103 and the magnitude of the current from the current source 105, the threshold voltage upon transition of the output signal to L level is made low.

The input circuit according to the present embodiment has a hysteresis because the current drivability of the NMOS transistor 103 is controlled by the output signal as described above.

Further, since the threshold voltage is determined by the magnitude of the current from the current source 105 and the current drivability of the NMOS transistor 103, the input circuit according to the embodiment is not affected by the power-supply voltage. In other words, the input circuit according to the present embodiment has a feature that the threshold voltage has no dependence on the power-supply voltage.

Figure 2:
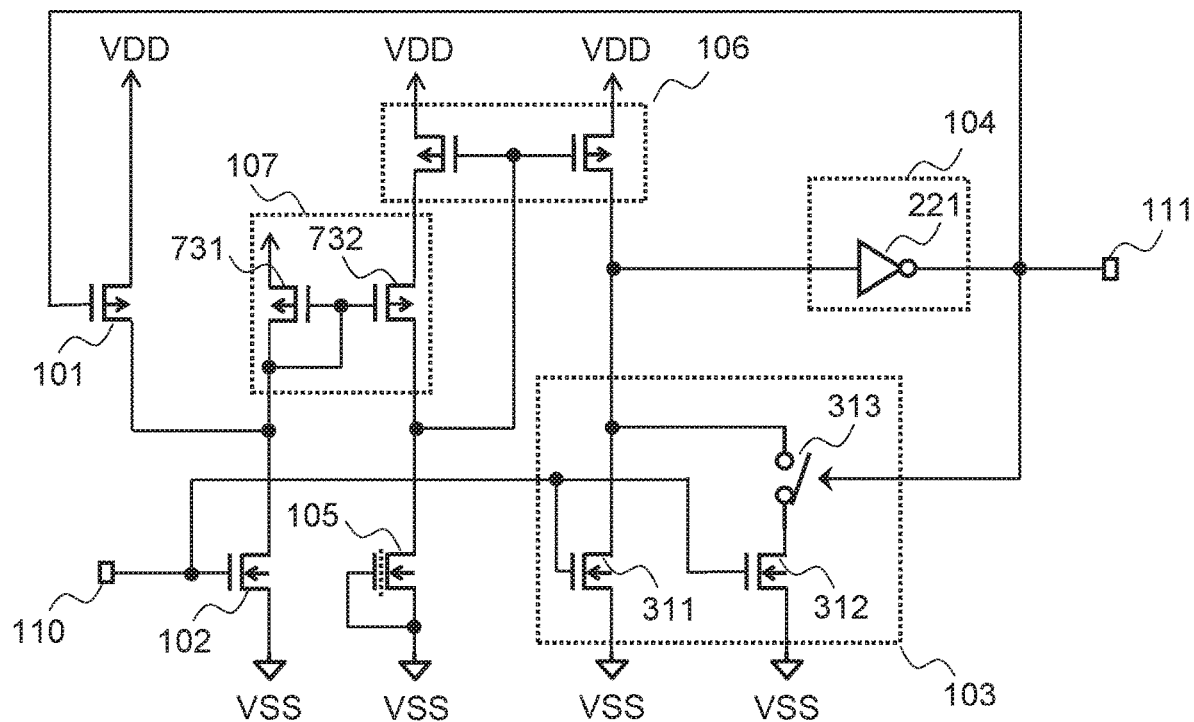
FIG. 2 is a circuit diagram illustrating a specific circuit example of the input circuit according to the embodiment.

FIG. 2 is a circuit diagram illustrating a specific circuit example of the input circuit according to the embodiment.

The NMOS transistor 103 includes NMOS transistors 311 and 312, and a switch 313.

The NMOS transistor 311 has the gate connected to the gate of the NMOS transistor 312 and to the input terminal 110, the drain connected to the output terminal of the current mirror 106, and the source connected to the second power-supply terminal. The drain of the NMOS transistor 312 is connected to the drain of the NMOS transistor 311 through the switch 313.

The switch 313 turns off at L level of the output from the buffer 104, i.e., at L level of the control signal, whereas the switch 313 turns on at H level of the control signal.

The NMOS transistor 103 is thus constructed and controlled, so that the current drivability is small at L level of the control signal and is large at H level of the control signal.

The switch 107 includes PMOS transistors 731, 732.

The PMOS transistor 731 and the PMOS transistor 732 form a current mirror. The drain of the PMOS transistor 731 is connected to the drain of the NMOS transistor 102 and the drain of the PMOS transistor 101. The PMOS transistor 732 has the source connected to the input of the current mirror 106 and the drain connected to the drain of the depletion transistor 105.

The switch 107 does not act as the current mirror, i.e., the switch 107 turns off when the PMOS transistor 101 turns on to make the drain of the PMOS transistor 731 at the voltage VDD (H level) of the first power-supply terminal. Further, the switch 107 acts as the current mirror, i.e., the switch 107 turns on when the PMOS transistor 101 turns off and the NMOS transistor 102 enters a state in which current flows (L level).

Since the switch 107 is thus constructed and controlled to turn on at L level of the voltage at the switch control terminal and turn off at H level.

Figure 3:
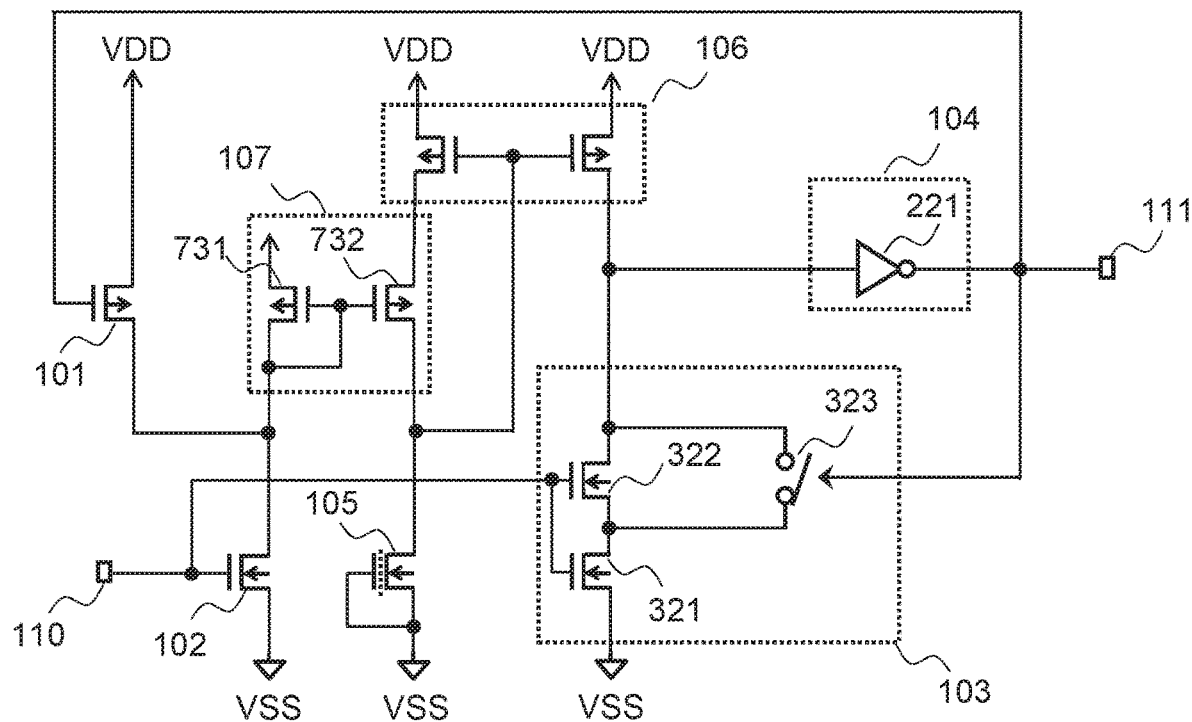
FIG. 3 is a circuit diagram illustrating another specific circuit example of the input circuit according to the embodiment.

FIG. 3 is a circuit diagram illustrating another specific circuit example of the input circuit according to the embodiment.

The NMOS transistor 103 includes NMOS transistors 321, 322, and a switch 323.

The NMOS transistor 321 and the NMOS transistor 322 are connected in series while respective gates are connected to each other to reach the input terminal 110. The switch 323 is connected to the transistor 322 in parallel.

The switch 323 turns off at L level of the output of the buffer 104, i.e., at L level of the control signal, and turns on at H level of the control signal.

Since the NMOS transistor 103 is thus constructed and controlled, so that the current drivability becomes small at L level of the control signal and becomes large at H level of the control signal.

Figure 4:
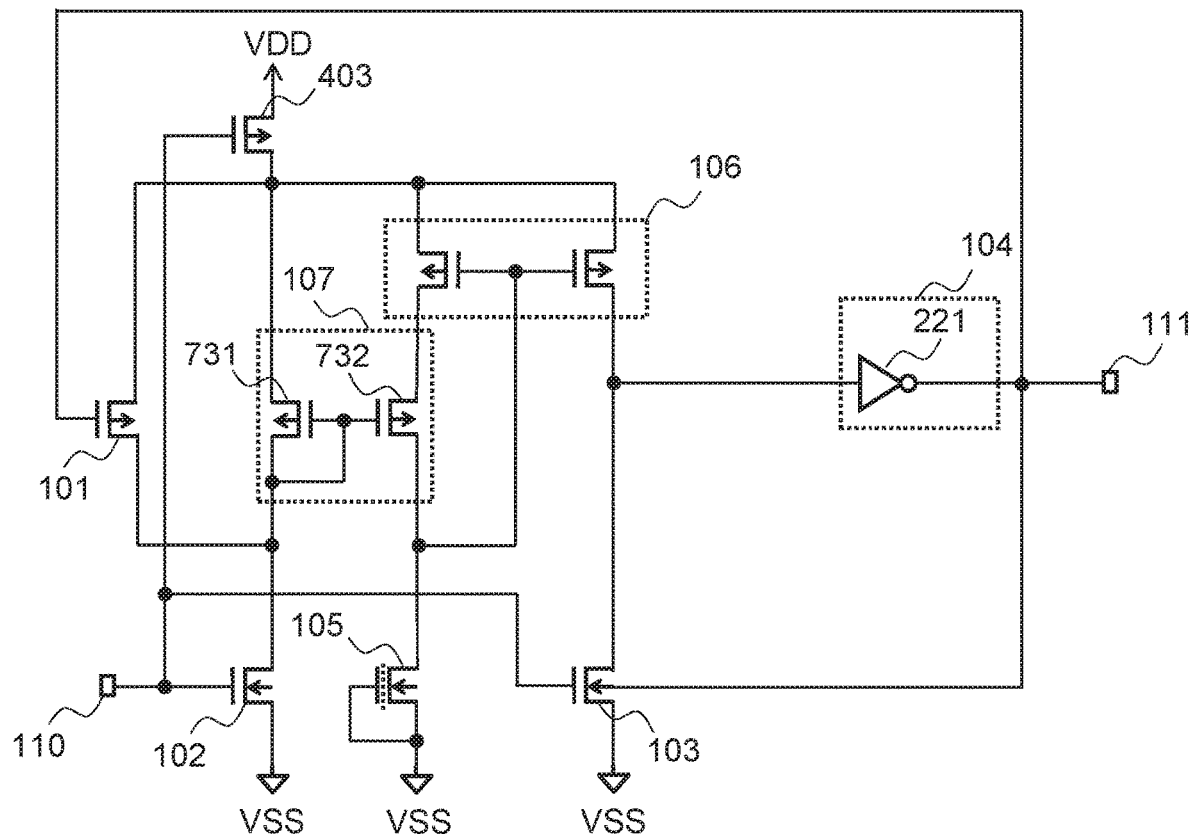
FIG. 4 is a circuit diagram illustrating still another specific circuit example of the input circuit according to the embodiment.
Figure 5:
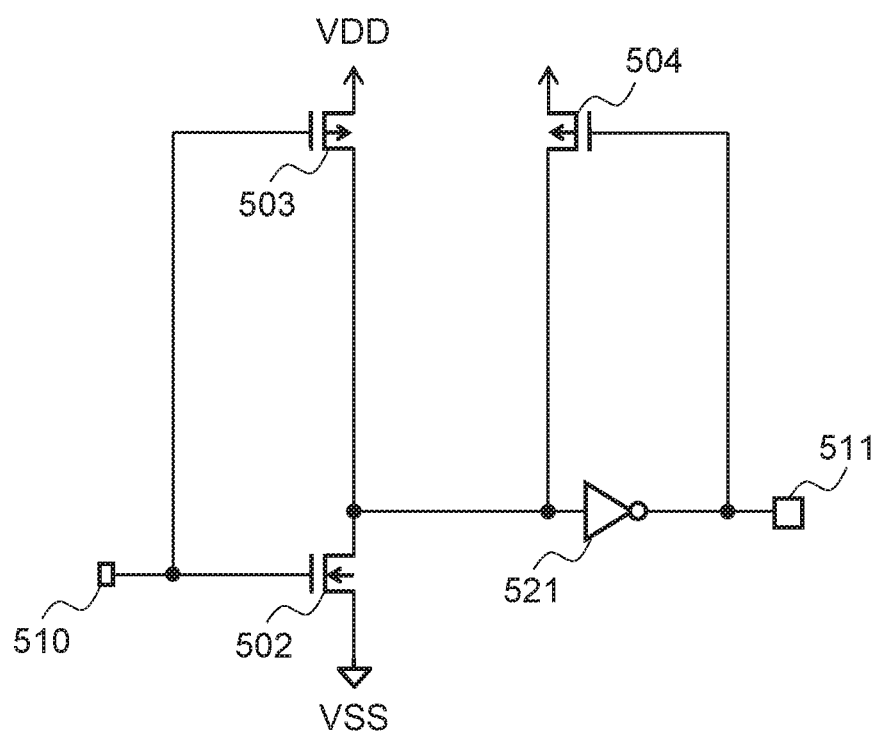
FIG. 5 is a circuit diagram illustrating a conventional input circuit.

FIG. 4 is a circuit diagram illustrating still another specific circuit example of the input circuit according to the embodiment.

Since the basic operation is the same as the input circuit described above, the detailed description thereof will be omitted.

The input circuit of FIG. 4 has a circuit configuration in which the current consumption is made further lower among the input circuits according to the embodiment. Specifically, the input circuit of FIG. 4 includes a PMOS transistor 403 as a switch in a current path between the first power-supply terminal and each of the NMOS transistor 102, the NMOS transistor 103, and the current source 105.

Since the PMOS transistor 403 turns off at H level of the input signal, no current flows in the current path of the NMOS transistor 102, of the NMOS transistor 103, and of the current source 105. The input circuit of FIG. 4 has the effect of making the current consumption lower than the above-described input circuits.

In FIG. 4, the tolerable lower limit of VDD is a major factor because on-state or off-state is affected by how much gate-source voltages across the PMOS transistor 403, and each of the NMOS transistor 102 and the NMOS transistor 103 can be acquired. In FIG. 4, no voltage in series with the gate-source voltage across the PMOS transistor 403, and each of the NMOS transistor 102 and the NMOS transistor 103 is generated. As a result, since the gate-source voltage across the PMOS transistor 403, and each of the NMOS transistor 102 and the NMOS transistor 103 can be applied effectively, the input circuit of FIG. 4 can operate even if the voltage VDD is low.

As described above, since the threshold voltage is determined by the magnitude of current of the current source 105 and the current drivability of the NMOS transistor 103, the input circuit according to the embodiment can have a hysteresis without power-supply voltage dependence.

While the embodiment of the present invention is described above, the present invention is not limited to the above-mentioned embodiment, and various changes are possible without departing from the gist of the present invention.

For example, the NMOS transistor 103 is composed of two NMOS transistors, but the NMOS transistor 103 may be composed of three or more NMOS transistors. Further, for example, the buffer 104 is a logic circuit for shaping the waveform of the drain voltage of the NMOS transistor 103.

However, if there is no need to shape the voltage waveform, the buffer 104 may not be provided.

What is claimed is:

1. An input circuit configured to output an output signal corresponding to an input signal, comprising:
    an input terminal;
    an output terminal;
    a first input transistor having a gate connected to the input terminal and a source connected to a second power-supply terminal;
    a second input transistor having a gate connected to the input terminal and a source connected to the second power-supply terminal, and configured to provide, to the output terminal, an output signal based on a voltage of a drain of the second input transistor;
    a transistor having a drain connected to a drain of the first input transistor and a source connected to a first power-supply terminal, wherein turning on/off of the transistor is controlled by a signal based on the output signal;
    a current source having one end connected to the second power-supply terminal;
    a first switch having one end connected to an other end of the current source and a switch control terminal connected to the drain of the first input transistor; and
    a current mirror having an input terminal connected to an other end of the first switch, an output terminal connected to the drain of the second input transistor, and a current-mirror control gate connected to the other end of the current source, wherein
    a current drivability of the second input transistor is switched by the output signal, and
    a threshold voltage to the input signal is determined based on the current drivability of the second input transistor and the current source.

2. The input circuit according to claim 1, further comprising
    a second switch provided between the first power-supply terminal and each of the first input transistor and the second input transistor,
    wherein the second switch turns off in response to turning-off of the first input transistor and the second input transistor by the input signal.

* * * * *